United States Patent
Kuo et al.

(10) Patent No.: US 6,571,307 B1
(45) Date of Patent: May 27, 2003

(54) MULTIPLE PURPOSE BUS FOR A SIMULTANEOUS OPERATION FLASH MEMORY DEVICE

(75) Inventors: Tiao-Hua Kuo, San Jose, CA (US); Nancy S. Leong, Sunnyvale, CA (US); Takao Akagoi, Cupertino, CA (US); Yasushi Kasa, Cupertino, CA (US)

(73) Assignees: Advanced Micro Devices, Inc., Sunnyvale, CA (US); Fujitsu Limited, Kanagawa (JP)

(*) Notice: Subject to any disclaimer, the term of this patent is extended or adjusted under 35 U.S.C. 154(b) by 0 days.

(21) Appl. No.: 09/421,758

(22) Filed: Oct. 19, 1999

(51) Int. Cl.[7] .............................................. G06F 13/00
(52) U.S. Cl. .................... 710/305; 365/189.04; 711/150
(58) Field of Search ........................ 365/185.11, 189.09, 365/185.33, 226, 89.04; 710/100, 107, 305; 711/150

(56) References Cited

U.S. PATENT DOCUMENTS

| | | | |
|---|---|---|---|
| 5,263,000 A | 11/1993 | Buskirk et al. | ............. 365/226 |
| 5,291,446 A | 3/1994 | Buskirk et al. | ........ 365/189.09 |
| 5,708,387 A | 1/1998 | Cleveland et al. | .......... 327/536 |
| 5,841,696 A | 11/1998 | Chen et al. | ............. 365/185.11 |
| 5,847,998 A | 12/1998 | Buskirk | ................. 365/185.33 |
| 5,867,430 A | 2/1999 | Chen et al. | ............. 365/189.04 |
| 6,005,803 A | 12/1999 | Kuo et al. | ............. 365/185.11 |
| 6,016,270 A | 1/2000 | Thummalapally et al. | ..................... 365/185.11 |

OTHER PUBLICATIONS

US 5,612,921, 3/1997, Chang et al. (withdrawn)
Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44.
AMD, Technology Background brochure, "3.0 Volt–only Page Mode Flash Memory Technology."
AMD, Technology Background brochure, "3.0 Volt–only Burst Mode Flash Memory Technology."
AMD, Technology Background brochure, "1.8 Volt–only Flash Memory Technology."
AMD, Technology Background brochure, "AMD DL160 and DL320 Series Flash: New Densities, New Features."
Intel Corporation, "Common Flash Memory Interface Specification", Release 1.1, May 30, 1997.
AMD, "Common Flash Memory Interface Publication 100—Vendor & Device ID Code Assignments", Jul. 25, 1996, Vol. 96.1.
AMD "Am29DL 162C/AM29DL 163C 16 Megabit (2 M × 8–Bit/1 M × 16–Bit) CMOS 3.0 Volt–only, Simultaneous Operation Flash Memory", Publication 21533, Rev: C Amendment/+2, Jul. 14, 1999.

(List continued on next page.)

*Primary Examiner*—Glenn A. Auve

(57) ABSTRACT

A multiple purpose bus for a flash memory device that allows six sets of data signals to utilize the bus. The multiple purpose bus includes sixteen circuit lines that extend from one end of the memory device to another end of the memory device. Control signals that correspond to each set of data signals couple the sets of data signals to the circuit lines. A grounding circuit is provided that couples the circuit lines to a ground when none of the sets of data signals are utilizing the multiple purpose bus.

18 Claims, 11 Drawing Sheets

OTHER PUBLICATIONS

Intel Corporation, "1.8 Volt Intel® Dual–Plane Flash Memory 28F320D18 (×16)", Product Review Datasheet, Order No.: 290672–002, Oct. 1999.

Macronix International Co., Ltd. "MXIC Advance Information MX29VW160T/B—16M–BIT [2M × 8–BIT/1M × 16–BIT] Simultaneous Read/Write Single 2.5V Operation Flash Memory", P/N:PM0567, Rev. 0.8, May 17, 1999.

ATMEL Corporation, "ATMEL® 16–megabit (1M × 16/2M × 8) 3–volt Only Flash Memory", Rev. 0925H–08/99.

STMicroelectronics, "M59DR032A, M59DR032B, 32 Mbit (2Mb × 16, Dual Bank, Page) Low Voltage Flash Memory", preliminary data, Oct. 1999, pp. 1–38.

"AMD—Flash Introduction", obtained at the internet address http://www.amd.com/products/nvd/overview/flash_intro.html, Apr. 14, 1999.

"AMD—Simultaneous Read/Write", obtained at the internet address http://www.amd.com/products/nvd/overviews/simuintro.html, Jul. 12, 1999.

"AMD News Release #9879", obtained at the internet address http://www.amd.com/news/prodpr/9879.html.

"Intel® 1.8 Volt Dual–Plane 32–Mbit Flash Memory (D18)", obtained at the internet address http://www.intel.com/design/flcomp/prodbref/298131.htm, Nov. 18, 1999.

MULTIPLE PURPOSE BUS FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention is directed to the field of non-volatile memories. More particularly, this invention relates to a non-volatile flash memory array with an arrangement that enables simultaneous read and write operations.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to a multiple purpose bus. A multiple purpose is provided that extends from one end of the memory device to another end of the memory device. Six sets of data signals utilize the multiple purpose bus, thereby minimizing the size of the memory device since additional circuit lines for each of the data signals is unnecessary. The multiple purpose bus includes sixteen circuit lines and is utilized by six different modes in which six different sets of data signals travel along the circuit lines. Control signals that correspond to each set of data signals couple and decouple the data signals from the circuit lines. When none of the six modes is active, the control signals cause a grounding circuit to couple each of the circuit lines to a ground.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M× 16-Bit) CMOS 3.0 Volt-only, Simultaneous Operation Flash Memory" Datasheet and "Am29DL162C/Am29L163C 16 Megabit (2M ×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
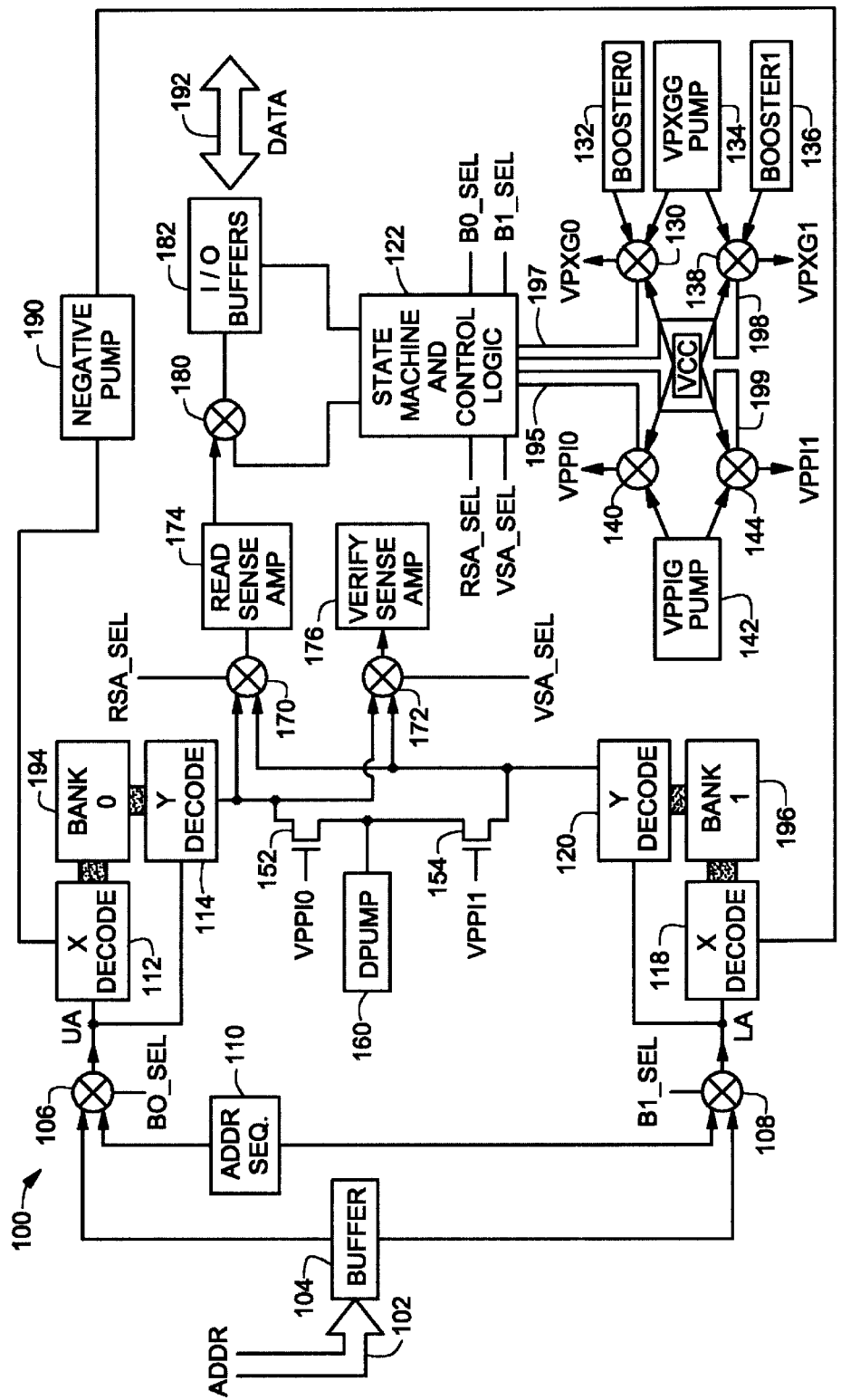
FIG. 1 depicts a block diagram of a flash memory chip according to the present invention that is capable of simultaneous reading and writing.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. For a more detailed discussion of the sliding bank architecture, refer to commonly assigned U.S. Pat. No. 5,995,415 entitled "SIMULTANEOUS OPERATION FLASH MEMORY DEVICE WITH A FLEXIBLE BANK PARTITION ARCHITECTURE," to Kou et al, U.S. Pat. No. 6,033,955 entitled "METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE," to Kou et al, and U.S. Pat. No. 6,275,894 entitled "BANK SELECTOR CIRCUIT FOR A SIMULTANEOUS OPERATION FLASH MEMORY DEVICE WITH A FLEXIBLE BANK PARTITION ARCHITECTURE," to Kou et al, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

Figure 2:
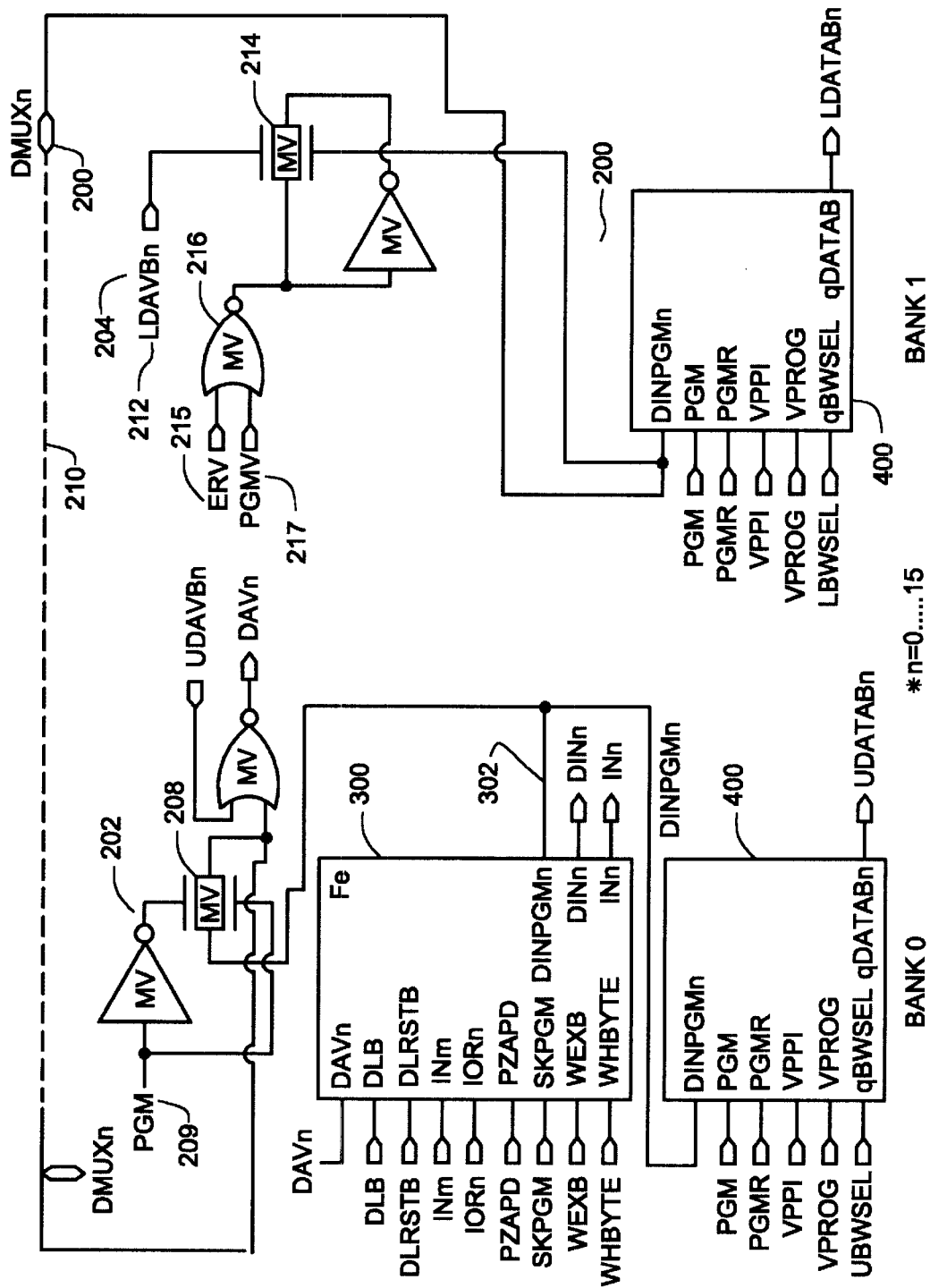
FIG. 2 depicts a schematic diagram of a multiple purpose bus.

Turning to the present invention and FIG. 2, a multiple purpose bus 200 extends from a first end 202 of the memory device 100 to a second end 204 of the memory device 100. The memory device 100 is relatively long in length so that the multiple purpose bus 200 is about six thousand micrometers in length. Because a variety of different data signals are required to travel between the first 202 and second 204 ends of the memory device 100, a multiple purpose bus 200 that can accommodate multiple sets of data is desirable. Without the multiple purpose bus 200, additional circuit lines extending between the first 202 and second 204 ends of the memory device 100 would be required to accommodate all the data signals that travel between the two ends 202, 204. This undesirable alternative would require additional space on the semiconductor die, which would cause the memory device 100 to be larger in size and would correspondingly result in a higher cost of manufacturing the memory device 100. For example, although variations are possible, the preferred embodiment of the memory device 100 would require up to sixty-eight circuit lines 210 without the multiple purpose bus 200 instead of only sixteen circuit lines 210 with the multiple purpose bus 200.

In the preferred embodiment, the multiple purpose bus 200 includes sixteen matching circuit lines 210 that extend between the first 202 and second 204 ends of the memory device 100. Accordingly, the circuit line 210 shown in FIG. 2 is duplicated sixteen times to constitute the entire multiple purpose bus 200. Additionally, in the case of data signals that utilize the entire bus 200 by traveling along all sixteen circuit lines 210, the circuits that generate, control, and receive the data signals are also duplicated sixteen times. On the other hand, in the case of data signals that only utilize a portion of the bus 200 by traveling along fewer than sixteen of the circuit lines 210, the corresponding circuits are duplicated only as many times as necessary to complete the entire set of data signals.

Figure 3:
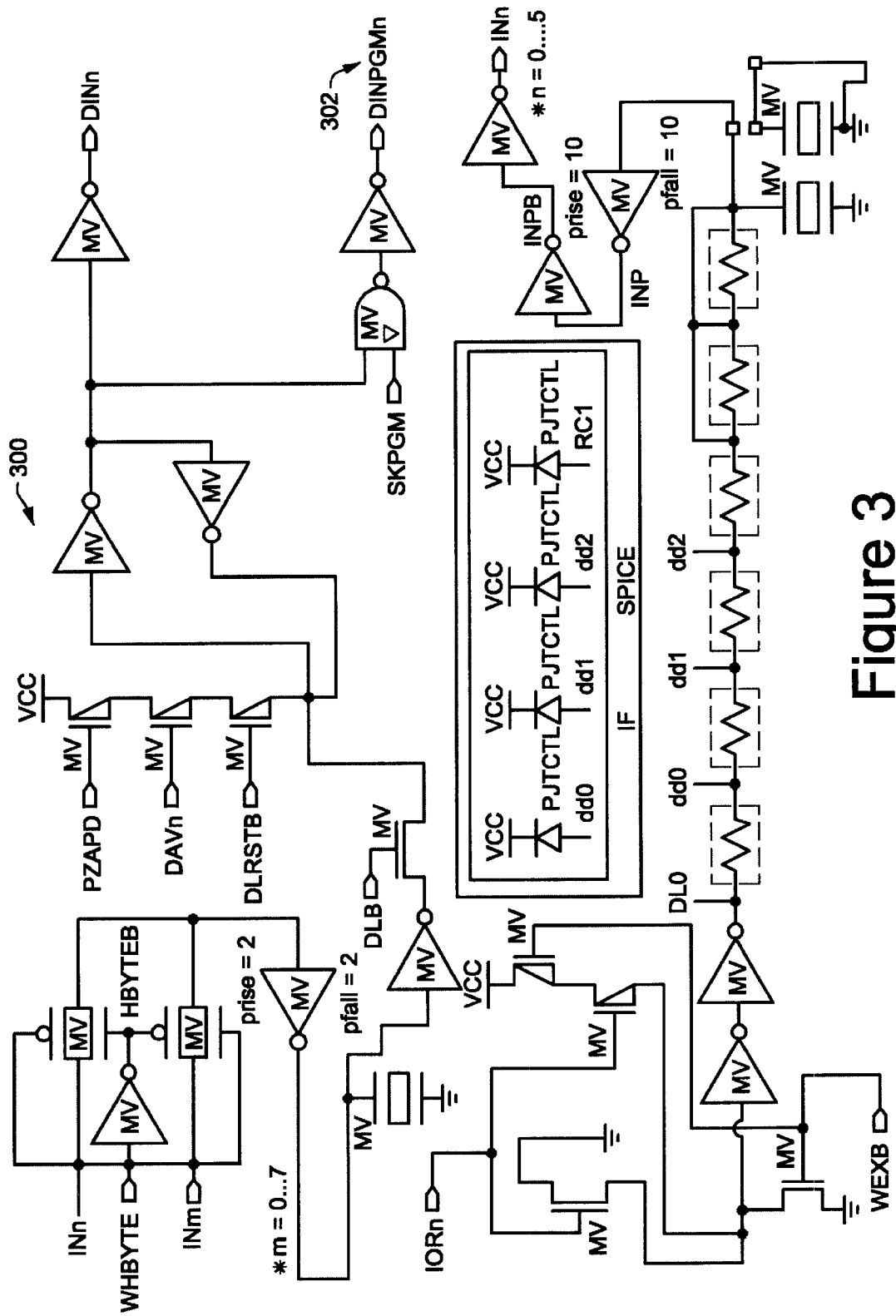
FIG. 3 depicts a schematic diagram of a program data generating circuit.

In the preferred embodiment, the multiple purpose bus 200 is used for six different modes of data signal transfer. In the first mode, program data signals 302 that are used for programming the memory arrays 194, 196 travel along the multiple purpose bus 200 from the first end 202 to the second end 204 of the memory device 100. Turning to FIG. 3, each of the program data signals 302 are generated by a program data generating circuit 300 and correspond to the user data that the user wishes to program into a memory array 194, 196. Although a single program data generating circuit 300 is shown in FIG. 3, the illustrated circuit 300 is duplicated sixteen times to correspond to each of the circuit lines 210 of the multiple purpose bus 200. Because the manner of generating the program data signals 302 is not essential to the invention and because those skilled in the art are well-versed in these matters, explanation regarding operation of the program data generating circuits 300 is unnecessary.

Turning back to FIG. 2, the memory device 100 of the preferred embodiment includes two separate banks of memory cells—Bank 0 and Bank 1, denoted by numerals 194 and 196, respectively. The program data signals thus travel to a Bank 0 buffer circuit 206 and a Bank 1 buffer circuit 400. For the sake of simplicity, the description to follow will address a single circuit line 210 with the understanding that the description is equally applicable to the other fifteen circuit lines 210 in the multiple purpose bus 200. Accordingly, a program mode pass gate 208 is provided near the first end 202 of the circuit line 210. As is generally well-known in the art, a pass gate requires a control signal, which is coupled to an n-channel transistor, and an inverse signal of the control signal, which is coupled to a p-channel transistor. Thus, when the control signal for a pass gate is asserted, an input to the pass gate passes through the pass gate, but when the control signal is deasserted, the input is blocked from passing through the pass gate. Therefore, from this explanation, it can be seen that the program data signal 302 is coupled to the circuit line 210 when the program control signal 209 is asserted and is decoupled from the circuit line 210 when the program control signal 209 is deasserted.

Figure 4:
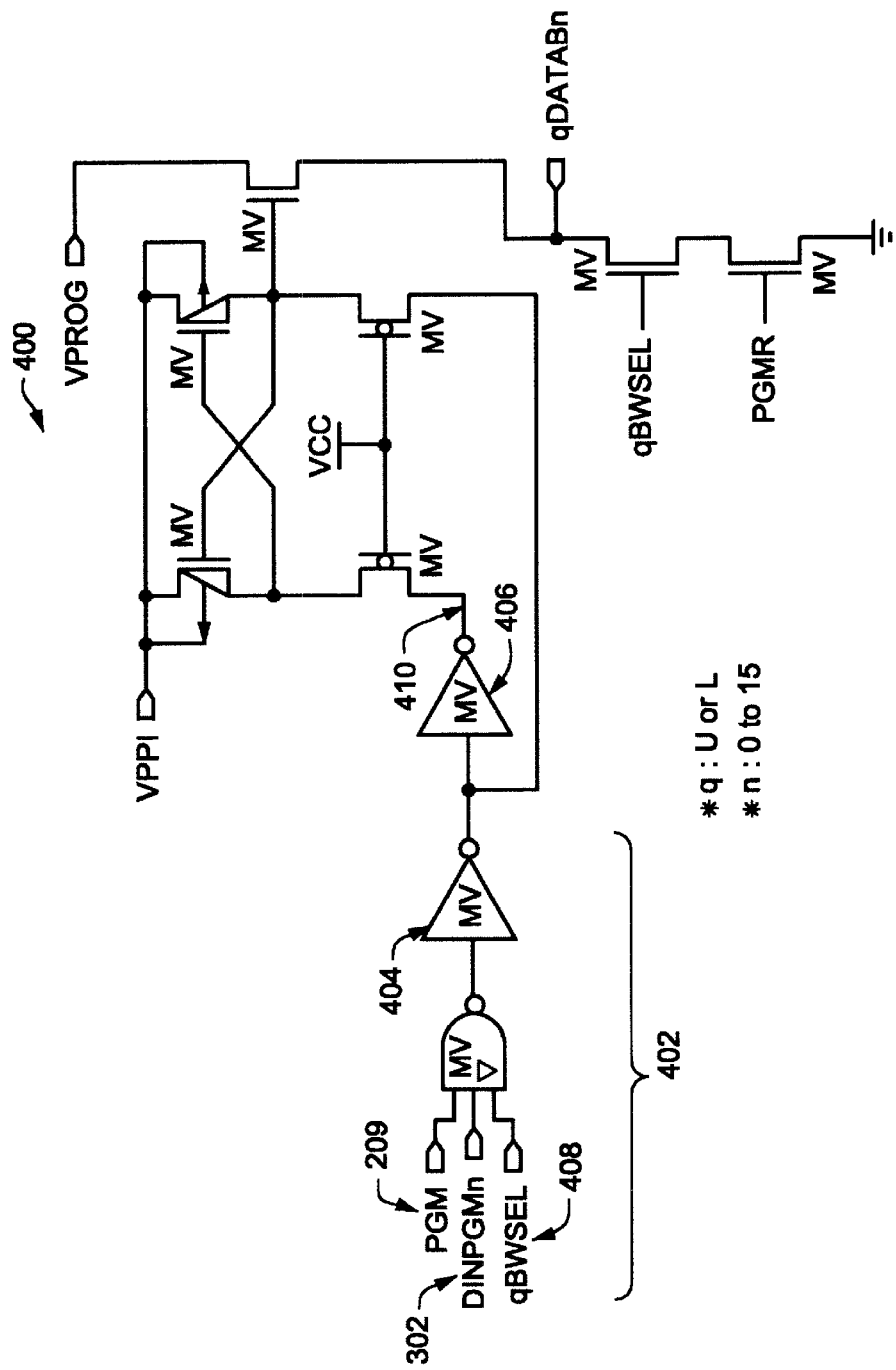
FIG. 4 depicts a schematic diagram of a Bank1 buffer circuit.

Turning to FIG. 4, a switching circuit 402 is provided within the Bank 1 buffer circuit 400 to prevent signal conflicts with the various signals that travel along the circuit line 210. The switching circuit 402 is provided at the input stage of the buffer circuit 400 and includes a NAND logic gate 404 and an inverter 406. The input signals 209, 302, 408 to the NAND logic gate 404 include the program control signal 209, the program data signal 302, and a bank selector signal 408. As is readily appreciated by those skilled in the art, the output 410 of the switching circuit 402 will be asserted when all three of the input signals 209, 302, 408 are asserted but will be deasserted when any one of the three input signals 209, 302, 408 is deasserted. Thus, the circuit line 210 will only be coupled to the core of the buffer circuit 400 when the program control signal 209 is asserted and the bank selector signal 408 is asserted (indicating Bank 1 196 is selected).

Returning to FIG. 2, in the verify mode verify data signals 212 travel along the multiple purpose bus 200 from the second end 204 to the first end 202 of the memory device 100 along all sixteen of the circuit lines 210. The verify data signals 212 correspond to the memory array 194, 196 data that is read after a programming operation is performed. These data signals 212 are compared to the user data to ensure that the programming operation was correctly performed. Accordingly, a verify mode pass gate 214 is provided near the second end 204 of the circuit line 210. A NOR logic gate 216 is provided as the control for the verify mode pass gate 214. The inputs 215, 217 to the NOR logic gate 216 are an erase verify control signal 215 and a program verify control signal 217. Accordingly, it should be readily appreciated by one skilled in the art, that the verify mode pass gate 214 will couple the verify data signal 212 to the circuit line 210 when either the erase verify control signal 215 is asserted or the program verify control signal 217 is asserted. If both of these control signals 215, 217 are deasserted, the verify mode pass gate 214 will decouple the verify data signal 212 from the circuit line 210. Finally, the verify data signal 212 travels along the circuit line 210 to a verify circuit 218 that is directly coupled to the circuit line 210 near its first end 202.

Figure 5:
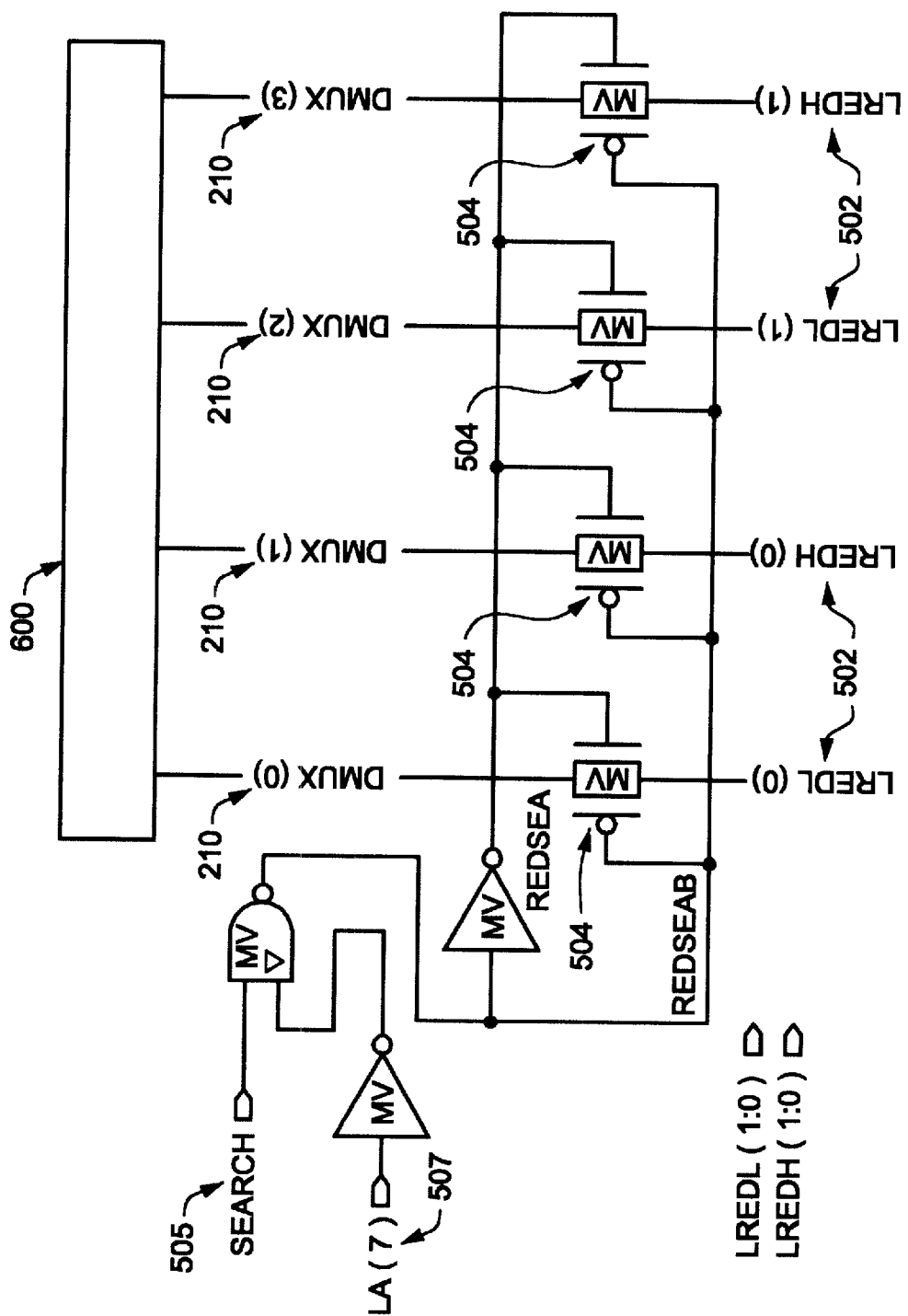
FIG. 5 depicts a schematic diagram of search mode pass gates.
Figure 6:
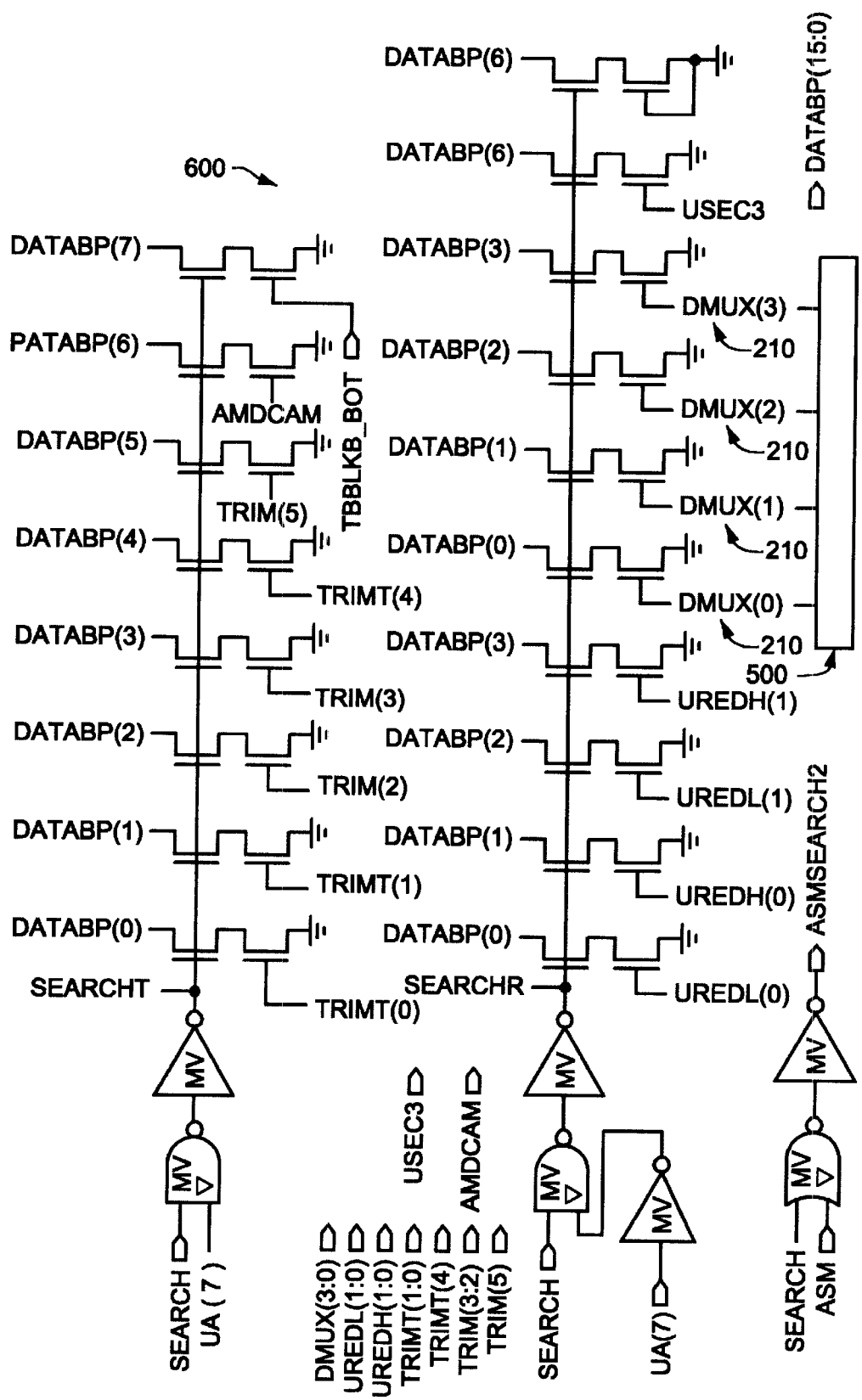
FIG. 6 depicts a schematic diagram of a search circuit.

Turning to FIG. 5 and 6, in the search mode only four search data signals 502 utilize the multiple purpose bus 200 to travel from the second end 204 to the first end 202 of the memory device 100. The search mode is a test function that is related to the manufacturing technique of replacing inoperative memory cells with redundant cells. The search data signals 502 indicate which elements (ex. bit lines) have been used for replacement. Accordingly, four corresponding search mode pass gates 504 are provided near the second end 204 of the circuit lines 210. As is now readily apparent from the previous explanations and from the figures, the search mode pass gates 504 couple the search data signals 502 to the first four corresponding circuit lines 210 when the search control signal 505 is asserted and the LA(7) signal 507 is deasserted. On the other hand, when the search control signal 505 is deasserted, the search mode pass gates 504 decouple the search data signals 502 from the corresponding circuit lines 210. The search data signals 502 then travel along the first four circuit lines 210 to the search circuit 600 that is directly coupled to the circuit lines 210 near the first end 204 of the circuit lines 210.

Figure 7:
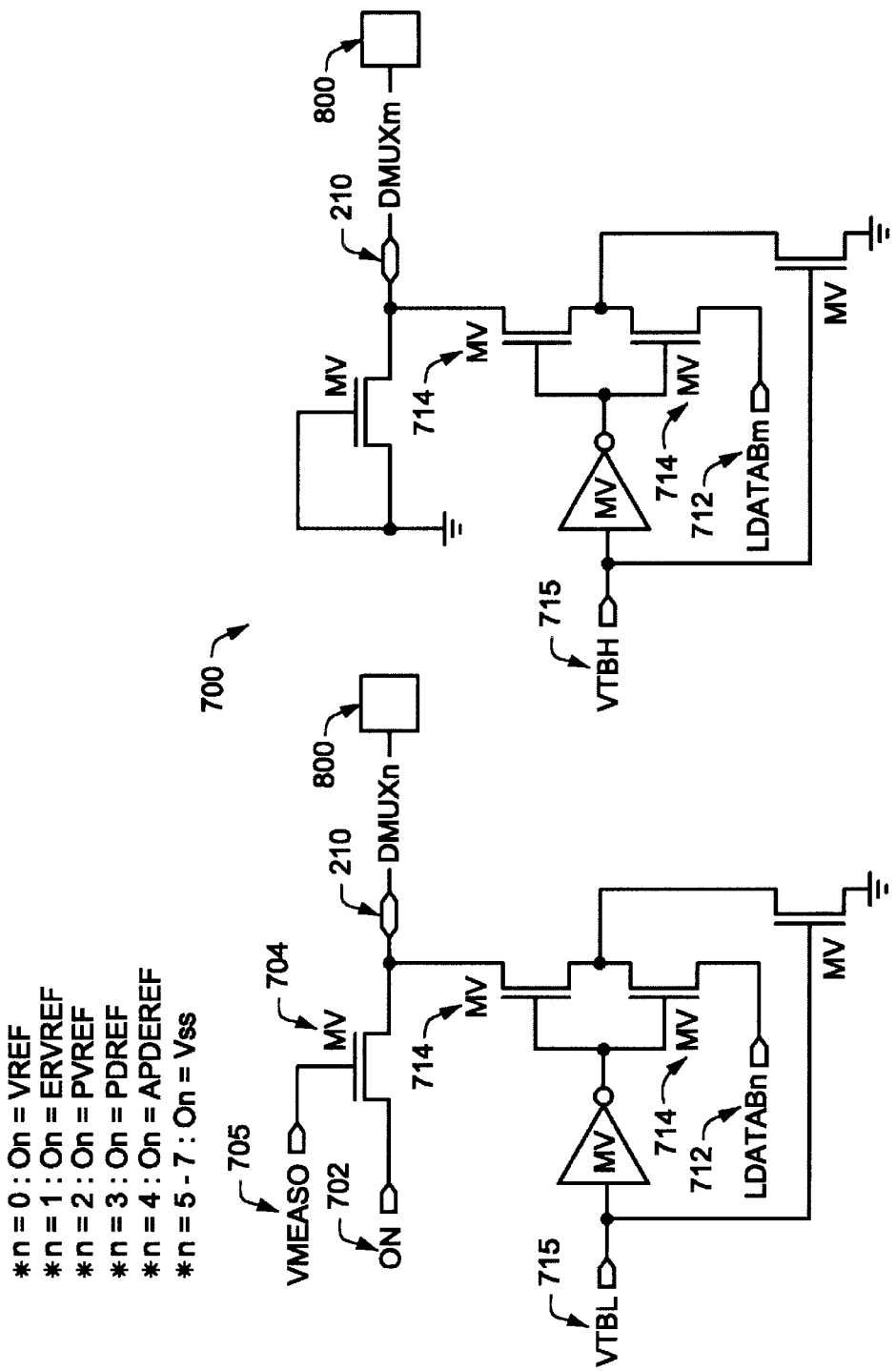
FIG. 7 depicts a schematic diagram of a VT_TOP circuit.
Figure 8:
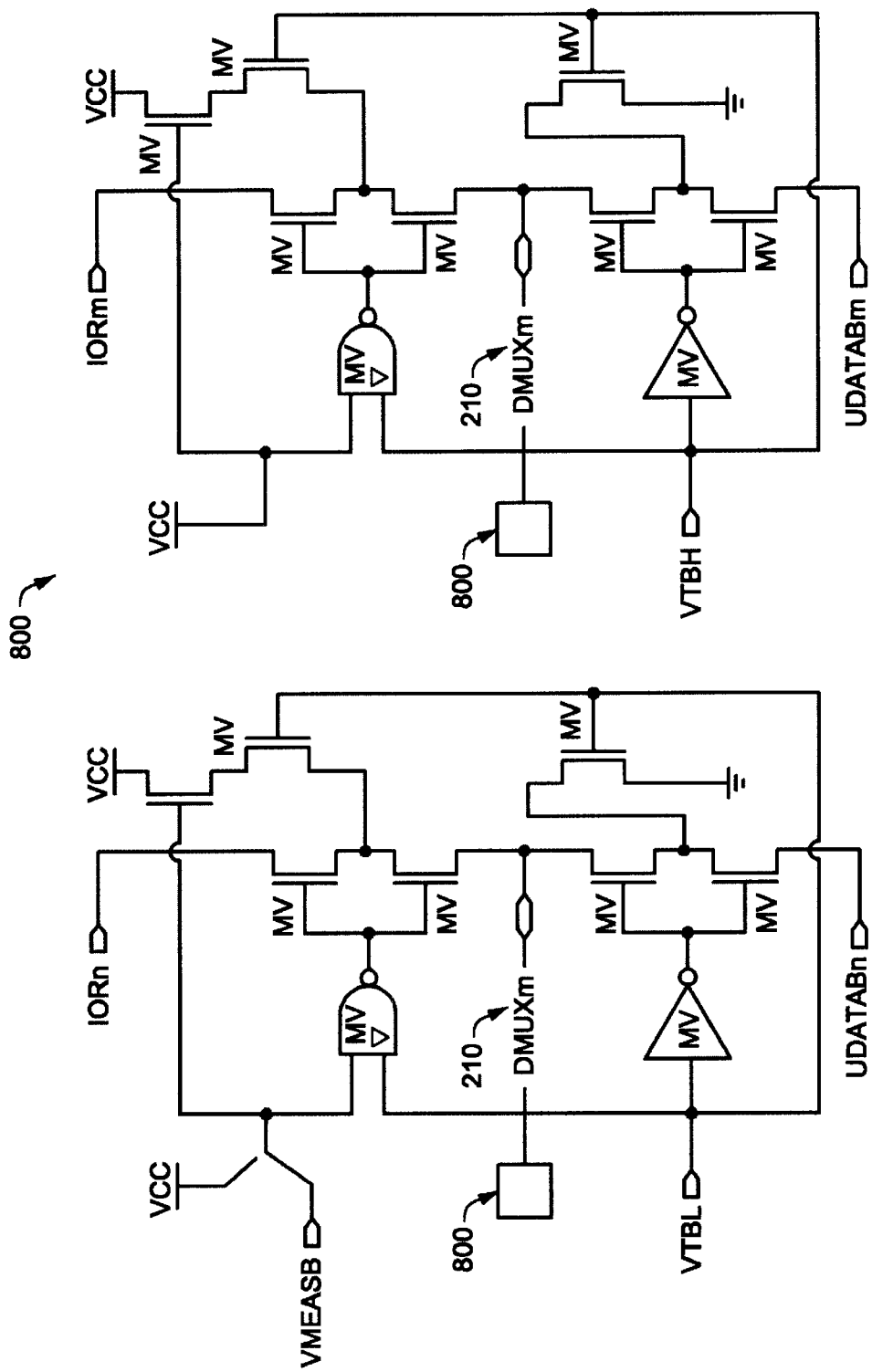
FIG. 8 depicts a schematic diagram of a VT_BOT circuit.

Turning to FIGS. 7 and 8, in the voltage measuring mode reference data signals 702 travel along the first eight circuit lines 210 from the second end 204 to the first end 202 of the circuit lines 210. The voltage measuring mode is a test function used for manufacturing quality control that compares the voltage of a small reference memory array to the core memory array 194, 196, where the reference data signals 702 correspond to the voltages of the small reference memory array. Accordingly, the reference data signals 702 are coupled to the circuit lines 210 by voltage measuring mode transistor gates 704 in the VT_TOP circuit 700 when the voltage measuring control signal 705 is asserted. When the voltage measuring control signal 705 is deasserted, the reference data signals 702 are uncoupled from the circuit lines 210 by the voltage measuring mode transistor gates 704. The reference data signals 702 then travel to the first end 202 of the circuit lines 210 to the VT_BOT 800 circuit which is directly coupled to the circuit lines 210.

In the array current mode, Bank 1 data signals 712 travel along all sixteen circuit lines 210 from the second end 204 to the first end 202 of the memory device 100. The array current mode is a test function used for manufacturing quality control that measures the internal core voltage of each of the memory cells in the memory array 194, 196 in order to determine the range of variation between the memory cells. Accordingly, the Bank 1 data signals 712 are coupled to the circuit lines 210 by two array current mode transistor gates 714 in the VT-TOP circuit 700 when the array current control signal 715 is deasserted. When the array current control signal 715 is asserted the array current mode transistor gates 714 decouple the Bank 1 data signals 712 from the circuit lines 210. The Bank 1 data signals 712 then travel to the first end 202 of the circuit lines 210 to the VT_BOT circuit 800.

Figure 9:
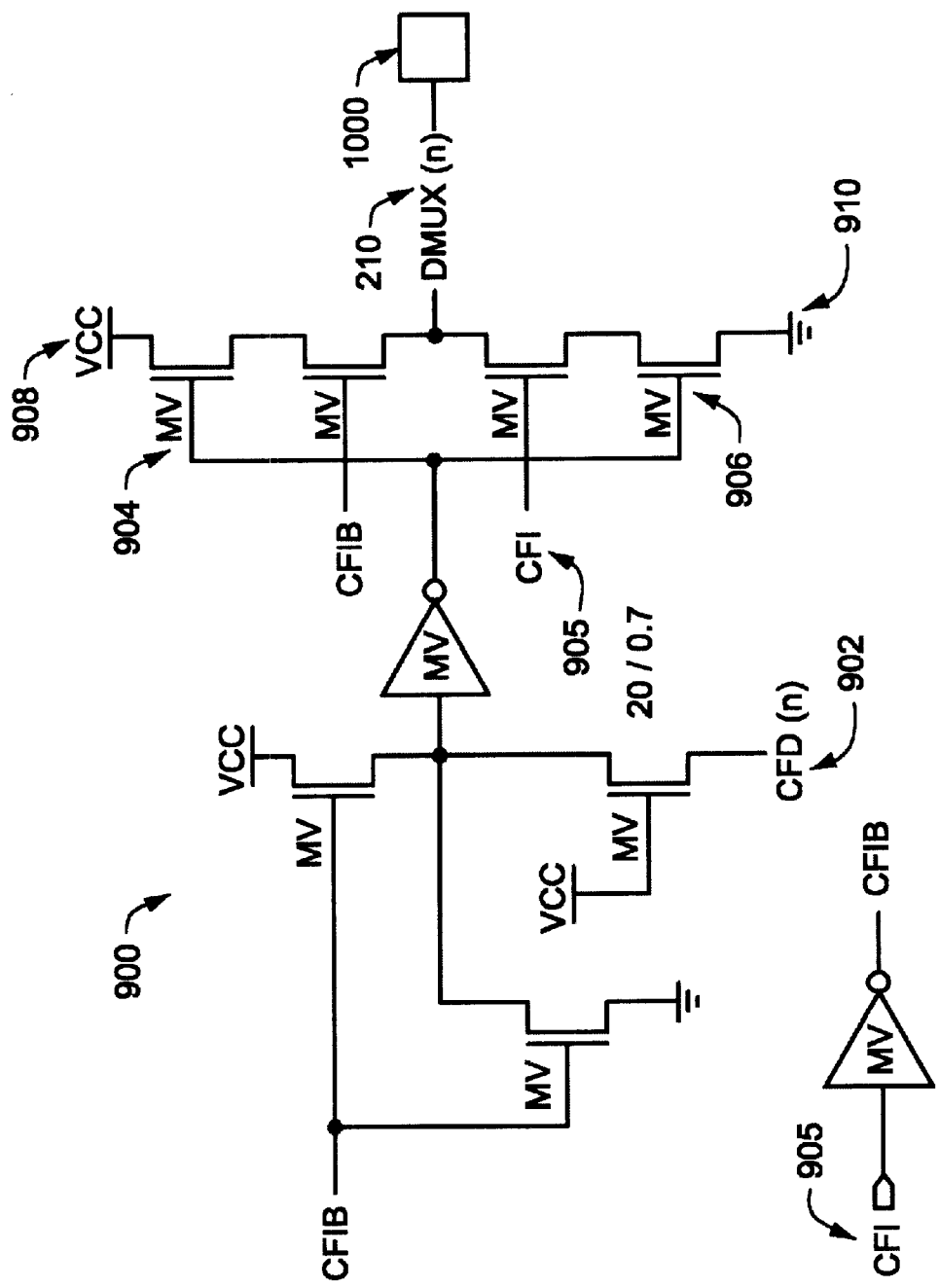
FIG. 9 depicts a schematic diagram of a CFI_DOUT circuit.
Figure 10:
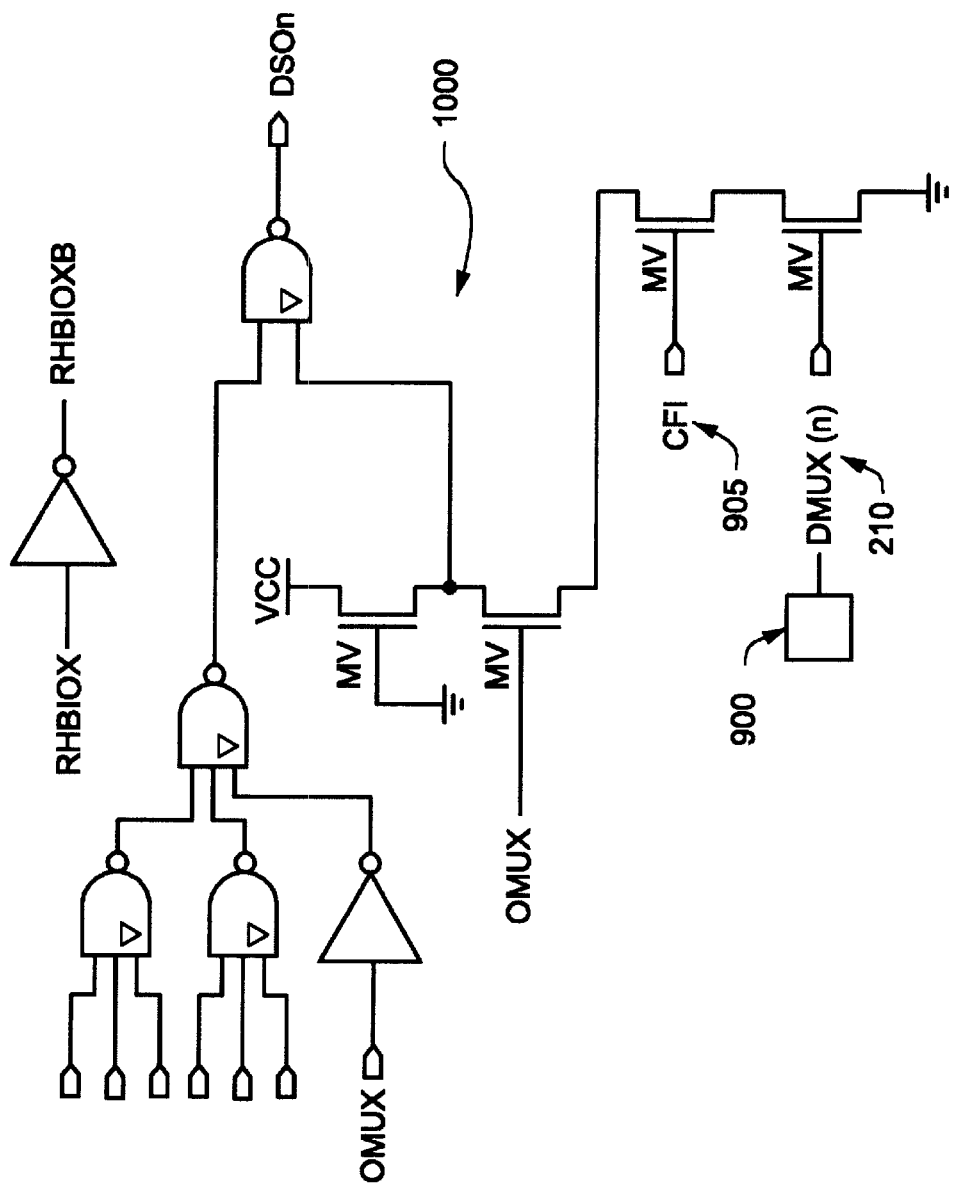
FIG. 10 depicts a schematic diagram of a IOXL circuit.

Turning to FIGS. 9 and 10, in the common flash interface ("CFI") mode CFI data signals 902 travel along the first eight circuit lines 210 from the second end 204 to the first end 202 of the memory device 100. The CFI mode is a user function that enables the user to determine the particular functions available with the memory device 100. The CFI data signals 902, therefore, correspond to a code that is fixed within the memory device 100 at the manufacturer that represents the available functions. When the CFI control signal 905 is asserted the circuit line 210 is alternatively coupled to VCC 908 or a ground 910 with a p-channel transistor 904 and an n-channel transistor 906 so that the resulting signal corresponds to the CFI data signal 902. When the CFI control signal 905 is deasserted, the circuit lines 210 are decoupled from the CFI_DOUT circuits 900.

The CFI data signals 902 then travel to the first end 202 of the circuit lines 210 to the IOXL circuits 1000.

Figure 11:
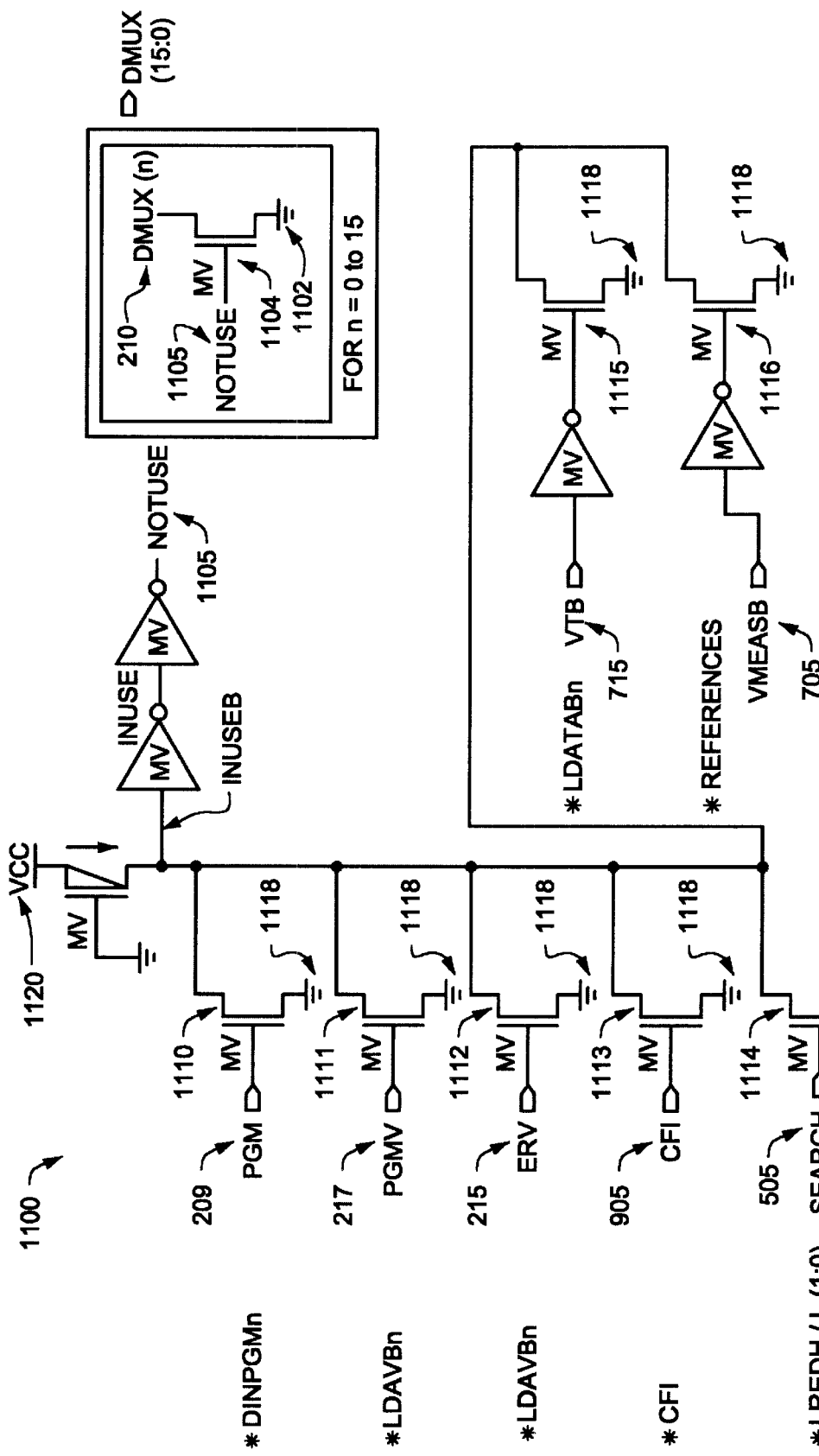
FIG. 11 depicts a schematic diagram of a grounding circuit.

Turning to FIG. 11, a grounding circuit 1100 is provided to couple the circuit lines 210 to a ground 1102 when none of the modes require the use of the multiple purpose bus 200. A single grounding circuit 1100 is provided, and the output 1105 of the grounding circuit 1100 serves as the control signal 1105 for sixteen transistor gates 1104 that are correspondingly coupled to each of the circuit lines 210 and a ground 1102. Thus, when the output 1105 of the grounding circuit 1100 is asserted each of the circuit lines 210 will be coupled to the ground 1102, but when the output 1105 of the grounding circuit 1100 is deasserted, the circuit lines 210 will be decoupled from the ground 1102. All of the control signals 209, 217, 215, 905, 505, 715, 705 from the modes previously discussed are represented in the grounding circuit—program control signal 209, program verify control signal 217, erase verify control signal 215, CFI control signal 905, search control signal 905, array current control signal 715, and voltage measuring control signal 705. Each of the control signals 209, 217, 215, 905, 505, 715, 705 controls a corresponding transistor gate 1110, 1111, 1112, 1113, 1114, 1115, 1116 that is coupled to a ground 1118 on one side and VCC 1120 on the other side. Thus, if any of the modes is active, the output 1105 of the grounding circuit 1100 will be deasserted; otherwise if none of the modes is active, the output 1105 will be asserted. Accordingly, the circuit lines 210 will be coupled to the ground 1102 when none of the modes is active and decoupled from the ground 1102 if any of the modes is active.

The figures give illustrative channel width to length ratios (measured in micrometers or microns) for the transistors which make up the depicted circuit. While the figures show the preferred channel width to length ratios for the transistors which make up the depicted logic, it will be appreciated that other ratios may also be used depending on the design requirements.

It is therefore intended that the foregoing detailed description be regarded as illustrative rather than limiting, and that it be understood that it is the following claims, including all equivalents, that are intended to define the spirit and scope of this invention.

We claim:

1. A multiple purpose data bus for a flash memory device, comprising:
 (a) a set of circuit lines extending from a first end of a flash memory device to a second end of the flash memory device;
 (b) a number of set of data signals;
 (c) a number of control signals, wherein
  (i) each of the control signals corresponds to one of said sets of data signals; and
  (ii) the control signals couple and decouple the set of data signals to said set of circuit lines; and (d) a grounding circuit for coupling said set of circuit lines to a ground when none of said sets of data signals is coupled to said set if circuit lines.

2. The multiple purpose data bus according to claim 1, wherein said set of circuit lines comprises sixteen circuit lines.

3. The multiple purpose data bus according to claim 2, wherein said set of circuit lines consists of sixteen circuit lines.

4. The multiple purpose data bus according to claim 1, wherein said set of circuit lines is approximately six thousand micrometers in length.

5. The multiple purpose data bus according to claim 1, wherein six of said sets of data signals is alternatively coupled to said circuit lines.

6. The multiple purpose data bus according to claim 5, wherein said sets of data signals includes a set of program data signals.

7. The multiple purpose data bus according to claim 5, wherein said sets of signals includes a set of verify data signals.

8. The multiple purpose data bus according to claim 5, wherein said sets of data signals includes a set of reference data signals.

9. The multiple purpose data bus according to claim 5, wherein said sets of data signals includes a set of search data signals.

10. The multiple purpose data bus according to claim 5, wherein said sets of data signals includes a set of Bank 1 data signals.

11. The multiple purpose data bus according to claim 5, wherein said sets of data signals includes a set of common flash interface data signals.

12. A method for using a multiple purpose data bus in a flash memory device, comprising:
   (a) coupling a set of data signals of a first mode to said multiple purpose data bus comprising a set of circuit lines, wherein each data signal of said first mode corresponds to a circuit line;
   (b) uncoupling a set of data signals of a second mode from said multiple purpose data bus comprising said set of circuit lines simultaneously with step (a), wherein each data signal of said second mode corresponds to a circuit line; and
   (c) coupling said multiple purpose data bus comprising said set of circuit lines to a ground when no sets of data signals is coupled to said set of circuit lines.

13. The method according to claim 12, wherein said set of data signals in step (a) is a set of program data signals.

14. The method according to claim 12, wherein said set of data signals in step (a) is a set of verify data signals.

15. The method according to claim 12, wherein said set of data signals in step (a) is a set of search data signals.

16. The method according to claim 12, wherein said set of data signals in step (a) is a set of reference data signals.

17. The method according to claim 12, wherein said set of data signals in step (a) is a set of Bank 1 data signals.

18. The method according to claim 12, wherein said set of data signals in step (a) is a set of common flash data signals.

* * * * *